(12) United States Patent
Flemming et al.

(10) Patent No.: US 11,264,167 B2
(45) Date of Patent: Mar. 1, 2022

(54) 3D CAPACITOR AND CAPACITOR ARRAY FABRICATING PHOTOACTIVE SUBSTRATES

(71) Applicant: 3D GLASS SOLUTIONS, INC., Albuquerque, NM (US)

(72) Inventors: Jeb H. Flemming, Albuquerque, NM (US); Jeff A. Bullington, Albuquerque, NM (US); Kyle McWethy, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

(21) Appl. No.: 16/079,033

(22) PCT Filed: Feb. 24, 2017

(86) PCT No.: PCT/US2017/019483
§ 371 (c)(1),
(2) Date: Aug. 22, 2018

(87) PCT Pub. No.: WO2017/147511
PCT Pub. Date: Aug. 31, 2017

(65) Prior Publication Data
US 2019/0074136 A1   Mar. 7, 2019

Related U.S. Application Data

(60) Provisional application No. 62/299,641, filed on Feb. 25, 2016.

(51) Int. Cl.
*H01G 4/008* (2006.01)
*H01G 4/38* (2006.01)
(Continued)

(52) U.S. Cl.
CPC ............. *H01G 4/008* (2013.01); *H01G 4/012* (2013.01); *H01G 4/08* (2013.01); *H01G 4/129* (2013.01);
(Continued)

(58) Field of Classification Search
CPC ............ H01G 4/008; H01G 4/38; H01G 4/33; H01G 4/12; H01G 4/018; H01G 4/06;
(Continued)

(56) References Cited

U.S. PATENT DOCUMENTS 2,515,940 A   7/1950   Stookey
2,515,941 A   7/1950   Stookey
(Continued)

FOREIGN PATENT DOCUMENTS

CN   1562831   4/2004
CN   105938928   9/2016
(Continued)

OTHER PUBLICATIONS

Azad, I., et al., "Design and Performance Analysis of 2.45 GHz Microwave Bandpass Filter with Reduced Harmonics," International Journal of Engineering Research and Development (2013), 5(11):57-67.
(Continued)

*Primary Examiner* — Arun Ramaswamy
(74) *Attorney, Agent, or Firm* — Edwin S. Flores; Chalker Flores, LLP

(57) ABSTRACT

The present invention provides a method of fabrication and device made by preparing a photosensitive glass substrate comprising at least silica, lithium oxide, aluminum oxide, and cerium oxide, masking a design layout comprising one or more holes or post to form one or more high surface area capacitive device for monolithic system level integration on a glass substrate.

13 Claims, 3 Drawing Sheets

(51) Int. Cl.
- *H01G 4/012* (2006.01)
- *H05K 3/00* (2006.01)
- *H01G 4/12* (2006.01)
- *H01G 4/08* (2006.01)
- *H01G 4/33* (2006.01)

(52) U.S. Cl.
CPC .............. *H01G 4/33* (2013.01); *H01G 4/38* (2013.01); *H05K 3/0002* (2013.01); *H01G 4/12* (2013.01)

(58) Field of Classification Search
CPC .......... H01G 4/085; H01G 4/30; H01G 4/129; H01G 4/08; H05K 3/0002
USPC ................... 361/301.4, 321.1, 311, 303, 328
See application file for complete search history.

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borelli et al. |
| 4,537,612 A | 8/1985 | Borelli et al. |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,686,824 B1 | 2/2004 | Yamamoto et al. |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 10,070,533 B2 | 9/2018 | Flemming et al. |
| 10,201,901 B2 | 2/2019 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borelli et al. |
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0150683 A1 | 7/2005 | Farnworth et al. |
| 2005/0170670 A1 | 8/2005 | King et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Debrow et al. |
| 2006/0177866 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamurar |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemminng et al. |

(56) References Cited

U.S. PATENT DOCUMENTS

| | | |
|---|---|---|
| 2010/0059265 A1 | 3/2010 | Myung-Soo |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamagaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2019/0280079 A1 | 7/2019 | Bouvier et al. |
| 2020/0275558 A1 | 8/2020 | Fujita |

FOREIGN PATENT DOCUMENTS

| | | |
|---|---|---|
| CN | 210668058 U | 6/2020 |
| DE | 102004059252 | 6/2006 |
| EP | 0311274 | 12/1989 |
| EP | 0507719 A1 | 10/1992 |
| EP | 0685857 B1 | 12/1995 |
| EP | 0949648 A1 | 10/1999 |
| EP | 1683571 | 6/2006 |
| JP | 56-155587 | 12/1981 |
| JP | 61149905 | 7/1986 |
| JP | 61231529 A | 10/1986 |
| JP | 62202840 A | 9/1987 |
| JP | 63-128699 A | 6/1988 |
| JP | 08026767 | 6/1988 |
| JP | H393683 A | 4/1991 |
| JP | 05139787 A | 6/1993 |
| JP | 08179155 A | 12/1994 |
| JP | 10007435 A | 1/1998 |
| JP | 10199728 A | 7/1998 |
| JP | 11344648 A | 12/1999 |
| JP | 2000228615 | 8/2000 |
| JP | 2001033664 A | 2/2001 |
| JP | 2001206735 A | 7/2001 |
| JP | 2005302987 A | 10/2005 |
| JP | 2005215644 A | 11/2005 |
| JP | 2006179564 A | 6/2006 |
| JP | 2008252797 A1 | 10/2008 |
| JP | 2012079960 A | 4/2012 |
| JP | 2013062473 A | 4/2013 |
| JP | 2013217989 A | 10/2013 |
| JP | 2014241365 A | 12/2014 |
| JP | 2015028651 | 2/2015 |
| JP | 2015028651 A | 2/2015 |
| JP | H08026767 | 1/2016 |
| JP | 2018200912 A | 12/2018 |
| KR | 100941691 B1 | 2/2010 |
| KR | 101167691 | 7/2012 |
| WO | 2007088058 A2 | 8/2007 |
| WO | 2008119080 | 10/2008 |
| WO | 2008154931 | 12/2008 |
| WO | 2009029733 | 3/2009 |
| WO | 2009062011 | 5/2009 |
| WO | 2009126649 | 10/2009 |
| WO | 2010011939 | 1/2010 |
| WO | 2011100445 | 8/2011 |
| WO | 20111109648 | 9/2011 |
| WO | 2012078213 A1 | 6/2012 |
| WO | 2014062226 A1 | 1/2014 |
| WO | 2014043267 | 3/2014 |
| WO | 2014062311 | 4/2014 |
| WO | 2015108648 A1 | 7/2015 |
| WO | 2015112903 | 7/2015 |
| WO | 2015171597 | 11/2015 |
| WO | 2017132280 | 8/2017 |
| WO | 2017147511 | 8/2017 |
| WO | 2017177171 | 10/2017 |

OTHER PUBLICATIONS

International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2018/068184 dated Mar. 19, 2019 by Australian Patent Office, 11 pp.
Papapolymerou, I., et al., "Micromachined patch antennas," IEEE Transactions on Antennas and Propagation, vol. 46, No. 2, 1998, pp. 275-283.
Aslan, et al, "Metal-Enhanced Fluorescence: an emerging tool in biotechnology" Current opinion in Biotechnology (2005), 16:55-62.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
Dang, et al. "Integrated thermal-fluidic I/O interconnects for an on-chip microchannel heat sink," IEEE Electron Device Letters, vol. 27, No. 2, pp. 117-119, 2006.

(56) References Cited

OTHER PUBLICATIONS

Dietrich, T.R., et al., "Fabrication Technologies for Microsystems Utilizing Photoetchable Glass," Microelectronic Engineering 30, (1996), pp. 407-504.

Extended European Search Report 15741032.5 dated Aug. 4, 2017, 11 pp.

Extended European Search Report 15789595.4 dated Mar. 31, 2017, 7 pp.

Geddes, et al, "Metal-Enhanced Fluorescence" J Fluorescence, (2002), 12:121-129.

Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.

Intel Corporation, "Intel® 82566 Layout Checklist (version 1.0)", 2006.

International Search Report and Written Opinion for PCT/US2008/058783 dated Jul. 1, 2008, 15 pp.

International Search Report and Written Opinion for PCT/US2008/074699 dated Feb. 26, 2009, 11 pp.

International Search Report and Written Opinion for PCT/US2009/039807 dated Nov. 24, 2009, 13 pp.

International Search Report and Written Opinion for PCT/US2009/051711 dated Mar. 5, 2010, 15 pp.

International Search Report and Written Opinion for PCT/US2011/024369 dated Mar. 25, 2011, 13 pp.

International Search Report and Written Opinion for PCT/US2013/059305 dated Jan. 10, 2014, 6 pp.

International Search Report and Written Opinion for PCT/US2015/012758 dated Apr. 8, 2015, 11 pp.

International Search Report and Written Opinion for PCT/US2015/029222 dated Jul. 22, 2015, 9 pp.

International Search Report and Written Opinion for PCT/US2017/019483 dated May 19, 2017, 11 pp.

International Search Report and Written Opinion for PCT/US2017/026662 dated Jun. 5, 2017, 11 pp.

International Search Report and Written Opinion for PCT/US2018/029559 dated Aug. 3, 2018, 9 pp.

International Technology Roadmap for Semiconductors, 2007 Edition, "Assembly and Packaging," 9 pages.

Lakowicz, et al; "Advances in Surface-Enhanced Fluorescence", J Fluorescence, (2004), 14:425-441.

Lewis, Sr., "Hawley's Condensed Chemical Dictionary." 13th ed, 1997, John Wiley and Sons. p. 231.

Lin, C.H., et al., "Fabrication of Microlens Arrays in Photosensitive Glass by Femtosecond Laser Direct Writing," Appl Phys A (2009) 97:751-757.

Livingston, F.E., et al., "Effect of Laser Parameters on the Exposure and Selective Etch Rate in Photostructurable Glass," SPIE vol. 4637 (2002); pp. 404-412.

Lyon, L.A., et al., "Raman Spectroscopy," Anal Chem (1998), 70:341R-361R.

Perro, A., et al., "Design and synthesis of Janus micro- and nanoparticles," J Mater Chem (2005), 15:3745-3760.

Quantum Leap, "Liquid Crystal Polymer (LCP) LDMOS Packages," Quantum Leap Datasheet, (2004), mlconnelly.com/QLPKG. Final_LDMOS_DataSheet.pdf, 2 pages.

Scrantom, Charles Q., "LTCC Technology—Where We Are and Where We're Going—IV," Jun. 2000, 12 pages.

TechNote #104, Bangs Laboratories, www.bangslabs.com/technotes/104.pdf, "Silica Microspheres".

TechNote #201, Bangs Laboratories, www.bangslabs.com/technotes/201.pdf, "Working with Microspheres".

TechNote #205, Bangs Laboratories, www.bangslabs.com/technotes/205.pdf, "Covalent Coupling".

Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.

Zhang, H., et al., "Biofunctionalized Nanoarrays of Inorganic Structures Prepared by Dip-Pen Nanolithography," Nanotechnology (2003), 14:1113-1117.

Zhang, H., et al., Synthesis of Hierarchically Porous Silica and Metal Oxide Beads Using Emulsion-Templated Polymer Scaffolds, Chem Mater (2004), 16:4245-4256.

Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.

European Search Report and Supplemental European Search Report for EP 18828907 dated Mar. 25, 2020, 11 pp.

International Search Report and Written Opinion for PCT/US2019/068586 dated Mar. 12, 2020 by USPTO, 10 pp.

International Search Report and Written Opinion for PCT/US2019/068590 dated Mar. 5, 2020 by USPTO, 9 pp.

International Search Report and Written Opinion for PCT/US2019/068593 dated Mar. 16, 2020 by USPTO, 8 pp.

Topper, et al., "Development of a high density glass interposer based on wafer level packaging technologies," 2014 IEEE 64th Electronic Components and Technology Conference, May 27, 2014, pp. 1498-1503.

Extended European Search Report 17744848.7 dated Oct. 30, 2019, 9 pp.

Extended European Search Report 17757365.6 dated Oct. 14, 2019, 14 pp.

International Search Report and Written Opinion for PCT/US2019/50644 dated Dec. 4, 2019 by USPTO, 9 pp.

Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.

International Search Report and Written Opinion for PCT/US2020/28474 dated Jul. 17, 2020 by the USPTO, 7 pp.

European Search Report and Supplemental European Search Report for EP 18889385.3 dated Dec. 2, 2020, 8 pp.

European Search Report and Supplemental European Search Report for EP 18898912.3 dated Feb. 2, 2021, 10 pp.

Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.

International Search Report and Written Opinion for PCT/US2020/54394 dated Jan. 7, 2021 by the USPTO, 15 pp.

International Search Report and Written Opinion for PCT/US2021/21371 dated May 20, 2021 by the USPTO, 10 pp.

Grine, F. et al., "High-Q Substrate Integrated Waveguide Resonator Filter With Dielectric Loading," IEEE Access vol. 5, Jul. 12, 2017, pp. 12526-12532.

Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.

International Search Report and Written Opinion for PCT/US2020/026673 dated Jun. 22, 2020, by the USPTO, 13 pp.

Mohamedelhassan, A., "Fabrication of Ridge Waveguides in Lithium Niobate," Independent thesis Advanced level, KTH, School of Engineering Sciences, Physics, 2012, 68 pp.

Muharram, B., Thesis from University of Calgary Graduate Studies, "Substrate-Integrated Waveguide Based Antenna in Remote Respiratory Sensing," 2012, 97 pp.

European Search Report and Supplemental European Search Report for EP 19784673.6 dated Feb. 2, 2021, 8 pp.

European Search Report and Supplemental European Search Report for EP 19811031 4 dated Feb. 26, 2021, 7 pp.

International Search Report and Written Opinion for PCT/US2021/27499 dated Jun. 16, 2021 by the USPTO, 7 pp.

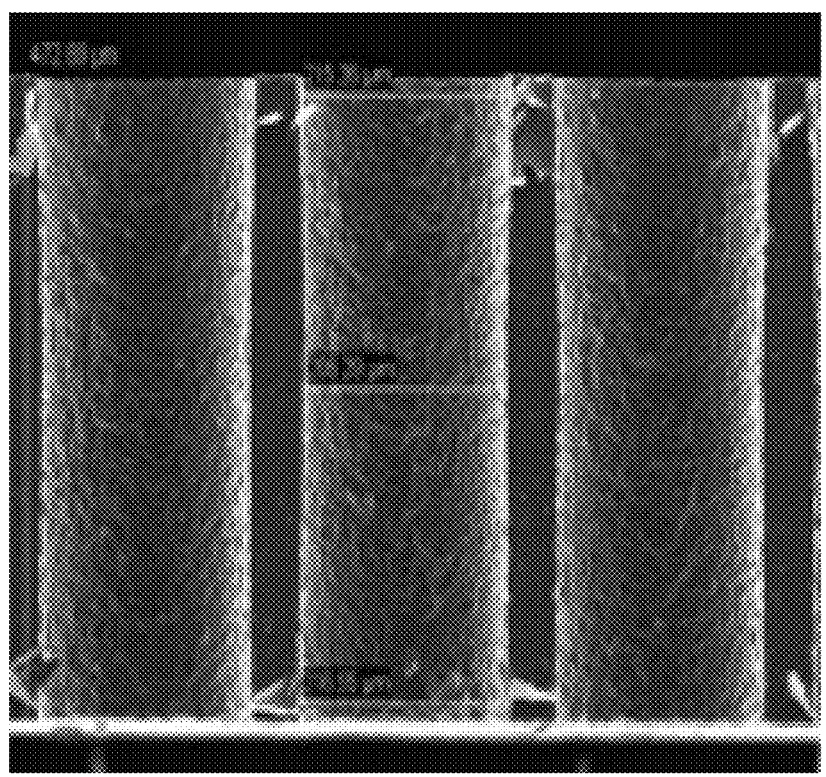
FIG. 4
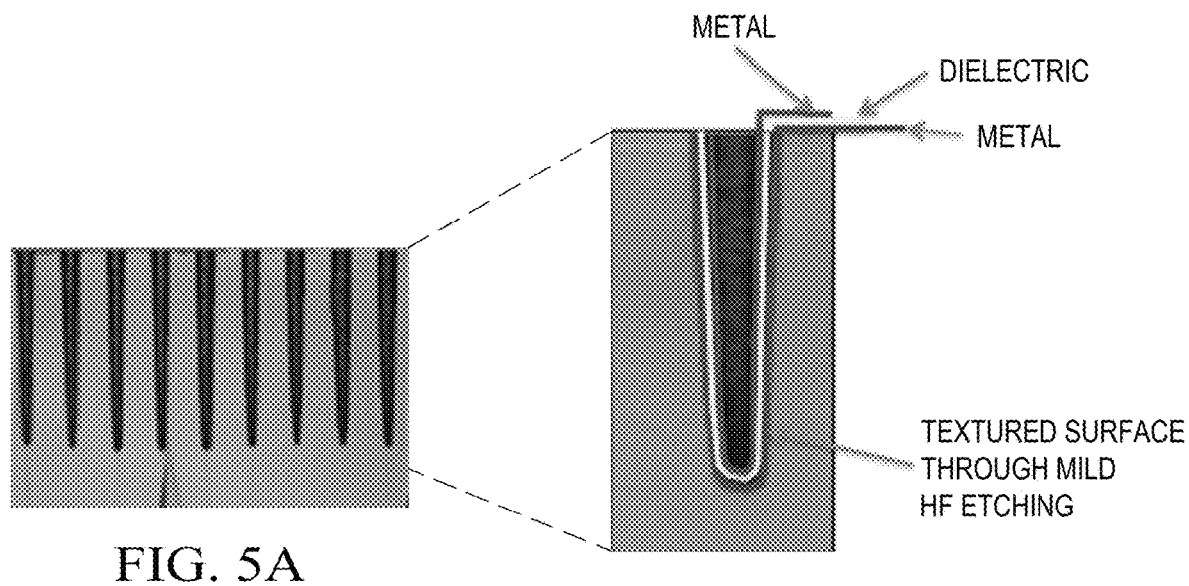
FIG. 5A
FIG. 5B

3D CAPACITOR AND CAPACITOR ARRAY FABRICATING PHOTOACTIVE SUBSTRATES

CROSS-REFERENCE TO RELATED APPLICATIONS

This application is a National Stage of International Application of PCT/US2017/019483, filed Feb. 24, 2017, which claims the benefit of U.S. Provisional Application No. 62/299,641, filed Feb. 25, 2016. The contents of each of which are incorporated by reference in their entirety.

FIELD OF INVENTION

The present invention relates to creating a three-dimensional capacitor structure in a photosensitive in-glass ceramic substrate, in particular, creating capacitors and in conjunction with other passive components for filters, surge protectors and storage for electronic, microwave and radio frequencies.

BACKGROUND ART

Photosensitive glass structures have been suggested for a number of micromachining and microfabrication processes such as integrated electronic elements in conjunction with other elements systems or subsystems. Silicon microfabrication of traditional glass is expensive and low yield while injection modeling or embossing processes produce inconsistent shapes. Silicon microfabrication processes rely on expensive capital equipment; photolithography and reactive ion etching or ion beam milling tools that generally cost in excess of one million dollars each and require an ultra-clean, high-production silicon fabrication facility costing millions to billions more. Injection molding and embossing are less costly methods of producing a three dimensional shapes but generate defects with in the transfer or have differences due to the stochastic curing process.

This invention creates a cost effective glass ceramic three-dimensional capacitor structure or three-dimensional capacitor array device. Where a glass ceramic substrate has demonstrated capability to form such structures through the processing of both the vertical as well as horizontal planes either separately or at the same time to form two or three-dimensional Capacitive devices.

SUMMARY OF THE INVENTION

The present invention includes a method to fabricate a substrate with one or more, two or three dimensional capacitor devices by preparing a photosensitive glass substrate with via or post and further coating or filling with one or more conductive layer typically a metal, dielectric material and a top layer conductive layer typically a metal.

A method of fabrication and device made by preparing a photosensitive glass ceramic composite substrate comprising at least silica, lithium oxide, aluminum oxide, and cerium oxide, masking a design layout comprising one or more, two or three dimensional capacitor device in the photosensitive glass substrate, exposing at least one portion of the photosensitive glass substrate to an activating energy source, exposing the photosensitive glass substrate to a heating phase of at least ten minutes above its glass transition temperature, cooling the photosensitive glass substrate to transform at least part of the exposed glass to a crystalline material to form a glass-crystalline substrate and etching the glass-crystalline substrate with an etchant solution to form one or more angled channels or through holes that are then used in the creation of capacitive device.

The present invention provides a glass ceramics capacitive device comprising: a first glass-crystalline substrate comprising one or more electrical conduction paths in the glass-crystalline substrate, and a metal coating applied to the one or more electrical conduction paths, wherein the first glass-crystalline substrate comprises at least silica, lithium oxide, aluminum oxide, and cerium oxide; a second glass-crystalline substrate comprising: one or more second electrical conduction paths in the second glass-crystalline substrate; and a second metal coating applied to the one or more second electrical conduction paths, wherein the second glass-crystalline substrate comprises at least silica, lithium oxide, aluminum oxide, and cerium oxide; a layer of dielectric material positioned between the first glass-crystalline substrate and the second glass-crystalline substrate; and one or more via, posts, channels, or a combination thereof connecting the first glass-crystalline substrate and the second glass-crystalline substrate. The first termination may be connected to the first glass-crystalline substrate and the second termination may be connected to the second glass-crystalline substrate. The glass ceramics capacitive device may preform as a voltage storage. The metal coating, the second metal coating or both may be Au, Ag, Pt, Cu, W, TiW, TiN, TaN, WN, $Al_2O_3$ or mixtures and alloys thereof. The dielectric layer may be $Ta_2O_5$, $Al_2O_3$ or other vapor phase dielectrics including but not limited to $Al_2O_3$.

The present invention provides a method of making a capacitive device created in or on photosensitive glass ceramics comprising the steps of: providing a photosensitive glass ceramic substrate comprising at least silica, lithium oxide, aluminum oxide, and cerium oxide; masking a design layout on the photosensitive glass ceramic substrate, wherein the design layout comprises one or more structures to form one or more electrical conduction paths; exposing at least one portion of the photosensitive glass ceramic substrate to an activating energy source; heating the photosensitive glass ceramic substrate to a heating phase of at least ten minutes above its glass transition temperature; cooling the photosensitive glass ceramic substrate to transform at least part of the exposed glass to a crystalline material to form a glass-crystalline substrate; etching the glass-crystalline substrate with an etchant solution to form the one or more three dimensional etched structure in the glass-crystalline substrate; optionally converting a portion of the glass-crystalline substrate adjacent to the three dimensional etched structure to a ceramic phase; rinsing the glass-crystalline substrate with a dilute glass etchant to form a high surface area texture to glass area; coating the via or post channels with a first metal to form a bottom electrode; coating at least a portion of the structure with a dielectric media; coating the via or post channels with a second metal to form a top electrode; removing at least a portion of the top and dielectric media to provide electrical contact or free standing device; and connecting the first metal, the second metal or both to a circuitry through a surface or buried contact.

The coating of the first metal, the second metal or both uses atomic layer deposition (ALD). The glass ceramics capacitive device preforms as a voltage storage. The first metal, the second metal or both comprise Au, Ag, Pt, Cu, W, TiW, TiN, TaN, WN, $Al_2O_3$ or mixtures and alloys thereof. The dielectric layer may be $Ta_2O_5$, $Al_2O_3$ or other vapor phase dielectrics.

BRIEF DESCRIPTION OF THE DRAWINGS

Further benefits and advantages of the present invention will become more apparent from the following description of various embodiments that are given by way of example with reference to the accompanying drawings.

DESCRIPTION OF THE INVENTION

Figure 1:
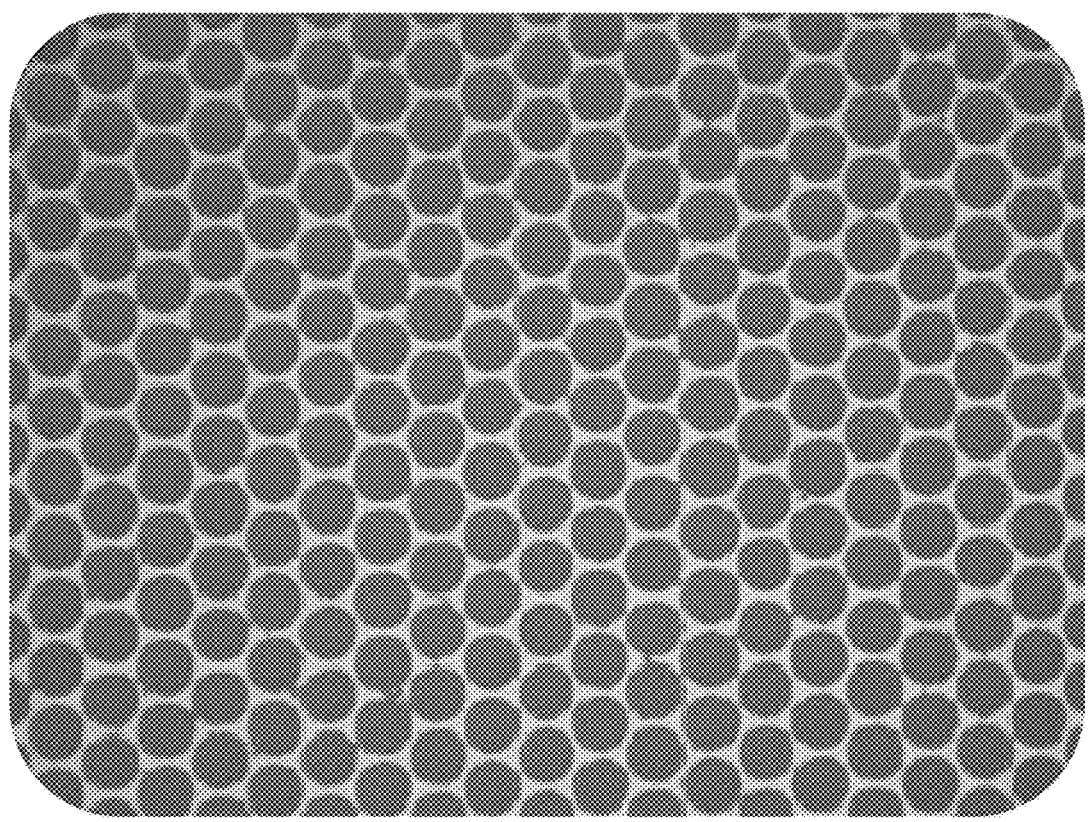
FIG. 1 Show a through hole via with 65 um diameter, 72 um center-to-center pitch.
Figure 2:
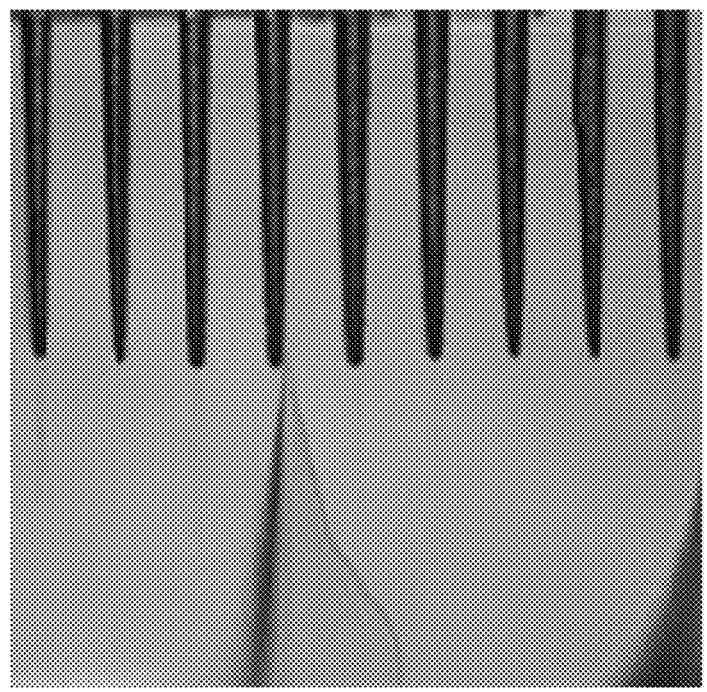
FIG. 2 Blind via in a 1 mm thick substrate where the via depth is 440 μm and the top diameter is 41 μm and bottom diameter is 19 μm FIG. 3A and FIG. 3B Top view of high surface area and high aspect ratio devices in/on APEX® Glass FIG. 4 Side view of filled through hole via in/on APEX® Glass FIG. 5A and FIG. 5B Show and exploded view of a blind via with the ADL capacitor structure in color.
Figure 3B:
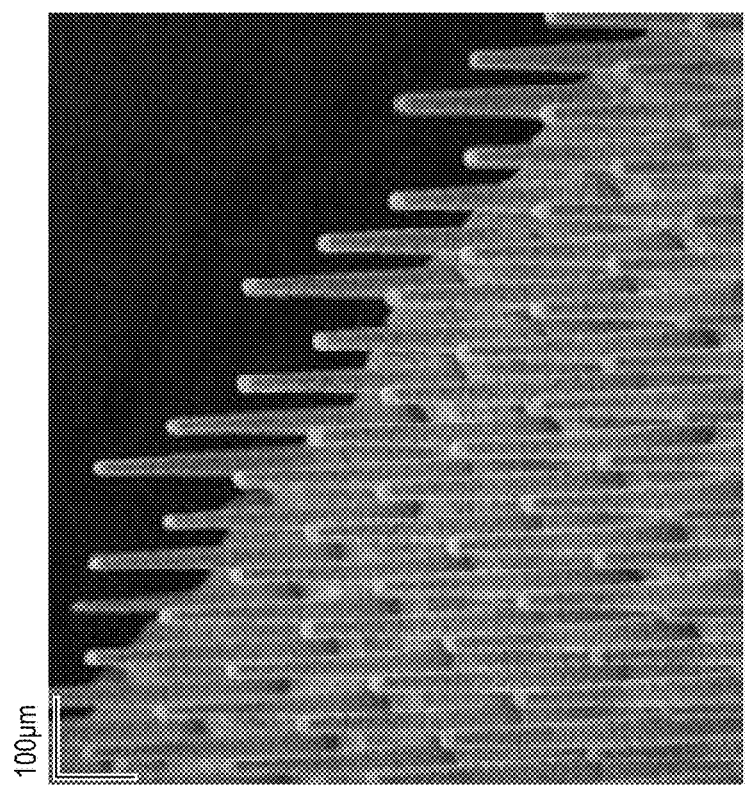
Figure 3A:
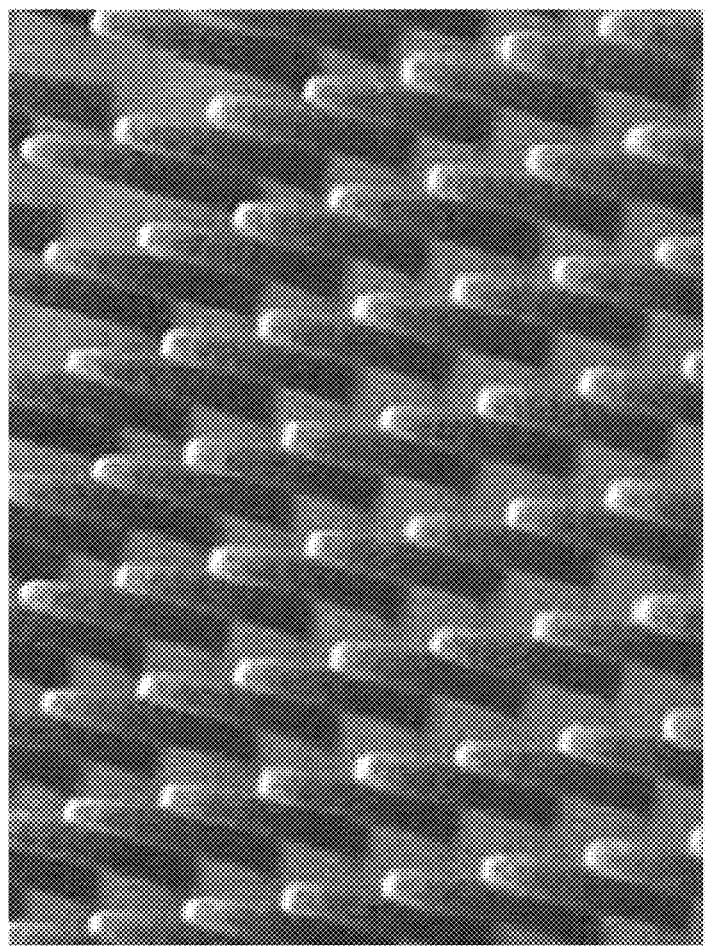

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

To address these needs, the present inventors developed a glass ceramic (APEX®) Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. The APEX® Glass ceramic possesses several benefits over current materials, including: easily fabricated high density via, demonstrated microfluidic capability, micro-lens or micro-lens array, high Young's modulus for stiffer packages, halogen free manufacturing, and economical manufacturing. Photoetchable glasses have several advantages for the fabrication of a wide variety of microsystems components. Microstructures have been produced relatively inexpensively with these glasses using conventional semiconductor processing equipment. In general, glasses have high temperature stability, good mechanical and electrical properties, and have better chemical resistance than plastics and many metals. To our knowledge, the only commercially available photoetchable glass is FOTURAN®, made by Schott Corporation and imported into the U.S. only by Invenios Inc. FOTURAN® comprises a lithium-aluminum-silicate glass containing traces of silver ions plus other trace elements specifically silicon oxide ($SiO_2$) of 75-85% by weight, lithium oxide ($Li_2O$) of 7-11% by weight, aluminum oxide ($Al2O_3$) of 3-6% by weight, sodium oxide ($Na_2O$) of 1-2% by weight, 0.2-0.5% by weight antimonium trioxide ($Sb_2O_3$) or arsenic oxide ($As_2O3$), silver oxide ($Ag_2O$) of 0.05-0.15% by weight, and cerium oxide ($CeO_2$) of 0.01-0.04% by weight. As used herein the terms "APEX® Glass ceramic", "APEX® glass" or simply "APEX®" is used to denote one embodiment of the glass ceramic composition of the present invention.

When exposed to UV-light within the absorption band of cerium oxide the cerium oxide acts as sensitizers, absorbing a photon and losing an electron that reduces neighboring silver oxide to form silver atoms, e.g.,

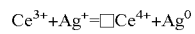

The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed.

Generally, glass ceramics materials have had limited success in microstructure formation plagued by performance, uniformity, usability by others and availability issues. Past glass-ceramic materials have yield etch aspect-ratio of approximately 15:1, in contrast APEX® Glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX™ Glass ceramic this conversion is closer to 70%.

APEX® Glass composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

Ceramicization of the glass is accomplished by exposing the entire glass substrate to approximately 20 J/cm² of 310 nm light. When trying to create glass spaces within the ceramic, users expose all of the material, except where the glass is to remain glass. In one embodiment, the present invention provides a quartz/chrome mask containing a variety of concentric circles with different diameters.

The present invention includes a method for fabricating an inductive device in or on glass ceramic structure electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O3$; and $Al_2O_3$ not exceeding 13 weight %; 8-15 weight % $Li_2O$; and 0.001-0.1 weight % $CeO_2$. This and other varied compositions are generally referred to as the APEX® glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that has an aspect ratio of at least 30:1, and to create an inductive structure. The mask for the exposure can be of a halftone mask that provides a continuous grey scale to the exposure to form a curved structure for the creation of an inductive structure/device. A digital mask can also be used with the flood exposure and can be used to produce the creation of an inductive structure/device. The exposed glass is then baked, typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1.

The present invention includes an inductive structures created in the multiple via or posts of a glass-ceramic substrate, such process employing the photodefinable glass structure containing at least one or more, two or three-dimensional capacitor device. The capacitive device is formed by one via or a series of via, where the via is either through hole or blind via, a depositing a bottom electrode, dielectric, and top electrode using an atomic layer deposition (ALD) process. The via may also receive an additional low concentrated rinse, with an etchant, such as dilute HF. The dilute HF will pattern or texture the ceramic wall of the via. The texturing of the ceramic wall significantly increases to the surface area of the structure directly increasing the capacitance of the device.

The capacitive device consists of a conductive layer that adheres well to glass, a dielectric layer, a top conductive layer and a final barrier layer. The APEX® Glass dimensional structure is coated with a layer less than 2 microns of TiN or other electrode material, followed by a 2 micron or less dielectric layer of $Ta_2O_5$, $Al_2O_3$ or other vapor phase dielectrics including but not limited to $Al_2O_3$. $Al_2O_3$ at 380° C. using TMA and $O_3$—cycle time: 3.5 s. The $Al_2O_3$ layer is then heated in oxygen ambient to 300° C. for 5 min fully oxidized the dielectric layer. Then depositing a top electrode of less than 2 microns of TiN by ALD. The top and bottom electrode need to be constructed from the same material to prevent the formation of a space charge in the dielectric. Depending on the size of the work function difference the space charge may be greater than what can be overcome with an external voltage without breaking down the dielectric layer rendering the capacitor useless. Eliminating the work function issue can be achieved by the creating an ohmic contact between the electrodes and dielectric. Additional metal and insulator layers may be added to increase capacitance.

Preferred Embodiment. A preferred structure is to create a capacitor structure where the via or post has a dilute HF wash to create a high textured surface area coated TiW metallization for the bottom electrode, Tantalum pent oxide for the dielectric and TiW metallization for the top electrode. The TiW bottom electrode requires a two-step ADL process. Step one is to deposit Ti using $TiCl_4$ rate of 1.67 Å/cycle in about 1.8 s cycle time at a substrate temperature of 300° C. to 400° C. The second step is to deposit tungsten (W) using Si—H and W—F mixed on the substrate's surface prior to purging. A linear growth rate of W requires equal portions of each reactant during the ALD cycle. Typical ALD growth for Tungsten is 6 Å cycle, with a cycle time of 3.5 s with a substrate temperature between 177° C. to 325° C. Alternating the ALD cycle from W to Ti at the substrate temperature necessary to achieve the deposition of both metals will result in the formation of a TiW layer. The process is repeated until the TiW structure reaches 20 Å. Next a $Ta_2O_5$ is formed by ALD using $TaCl_5$ precursor in the presence of atomic hydrogen. Tantalum films are deposited at a substrate temperature of 25-400° C. with an ALD cycle time of 1.8 s. After each ALD cycle, the Tantalum films are exposed to $O_2$ for 30 seconds while the substrate is at 400° C. This converts the metallic Tantalum film to $Ta_2O_5$. The device is completed by applying a top electrode of TiW in the same manner as the bottom electrode. The very nature of ALD process enables dense conformal coatings.

Finishing the capacitor structure requires etching down to the bottom electrode so electrical connection can be made to both contacts of the capacitor. This is accomplished by coating the structure with a standard positive photoresist. Exposing the photoresist with a rectangular over part of the capacitor structure. Then developing and removing the photoresist over the capacitor exposing the top TiW photoresist electrode. The TiW electrode is etched with $SF_6$/He plasmas in a using a Tegal 804 plasma etching system. This etch rate with 200 W of forward power is 200 Å/min. This etch is preferentially relative to the $Ta_2O_5$ layer, making the $Ta_2O_5$ layer an effective etch stop. The $Ta_2O_5$ a plasma etch using Ar/Cl (10%/90%) mixture with 300 W of forward power with a 1200 Å/min etch rate. The Ar/Cl plasma does not attack/etch the TiW bottom electrode. This allows the top and bottom electrode for the capacitor to be connected to the rest of the circuit by a wide number of standard thick and thin film processes.

A second embodiment uses a through hole via that may have the ceramic phase etched with a dilute HF solution to create a textured high surface area on one side or both sides to partially or fully remove the glass-ceramic as the base substrate for the capacitive structure. A third embodiment use a posts on one or both sides of the APEX® Glass substrate that may have the ceramic phase etched with a dilute HF to create to a high surface area capacitive structure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A glass ceramic capacitive device created within a three-dimensional structure etched within a single photosensitive glass ceramic substrate, wherein the etched three-dimensional structure has an anisotropic etch ratio of at least 30:1, comprising:
    a first glass-crystalline substrate comprising:
        at least silica, lithium oxide, aluminum oxide, and cerium oxide,
        one or more first electrical conduction paths in the first glass-crystalline substrate, and
        a first metal coating applied to the one or more first electrical conduction paths;
    a second glass-crystalline substrate comprising:
        at least silica, lithium oxide, aluminum oxide, and cerium oxide,
        one or more second electrical conduction paths in the second glass-crystalline substrate; and
        a second metal coating applied to the one or more second electrical conduction paths; and
    a layer of dielectric material positioned between the first glass-crystalline substrate and the second glass-crystalline substrate; and
    one or more vias, post channels, or a combination thereof directly connecting the first glass-crystalline substrate and the second glass-crystalline substrate, wherein the one or more vias or post channels are formed having increased surface area that provides an increased capacitance in the glass ceramic capacitive device.

2. The device of claim 1, further comprising a first termination connected to the first glass-crystalline substrate and a second termination connected to the second glass-crystalline substrate.

3. The device of claim 1, wherein the first metal coating, the second metal coating or both comprise Au, Ag, Pt, Cu, W, TiW, TiN, TaN, WN, $Al_2O_3$ or mixtures and alloys thereof.

4. The device of claim 1, wherein the dielectric layer comprises $Ta_2O_2$, $Al_2O_3$ or other vapor phase dielectrics including but not limited to $Al_2O_3$.

5. The device of claim 1, wherein the first metal coating, the second metal coating, the layer of dielectric material, or some combination are applied using atomic layer deposition.

6. A method of making a capacitive device in or on photosensitive glass ceramics comprising the steps of:
    providing a photosensitive glass ceramic substrate comprising at least silica, lithium oxide, aluminum oxide, and cerium oxide;
    masking a design layout on the photosensitive glass ceramic substrate, wherein the design layout comprises one or more structures to form one or more electrical conduction paths;
    exposing at least one portion of the photosensitive glass ceramic substrate to an activating energy source;
    heating the photosensitive glass ceramic substrate to a heating phase of at least ten minutes above its glass transition temperature;
    cooling the photosensitive glass ceramic substrate to transform at least part of the exposed photosensitive glass ceramic substrate to a crystalline material to form a glass-crystalline substrate;
    etching the glass-crystalline substrate with an etchant solution to form one or more three dimensional etched structures in the glass-crystalline substrate;
    converting a portion of the glass-crystalline substrate adjacent to the one or more three dimensional etched structures to a ceramic phase;
    rinsing an interior surface of each of the one or more three dimensional etched structures with a dilute glass etchant to form a high surface area texture;
    coating at least a portion of the interior surface of each of the one or more three dimensional etched structures with a first metal to form a bottom electrode;
    coating at least a portion of the bottom electrode with a dielectric media;
    coating at least a portion of the dielectric media with a second metal to form a top electrode;
    removing at least a portion of the top electrode and the dielectric media to provide an electrical contact or free standing device; and
    connecting the bottom electrode, the top electrode or both to a circuitry through a surface or buried contact.

7. The method of claim 6, wherein the coating of the first metal, the second metal or both uses atomic layer deposition.

8. The method of claim 6, wherein the first metal, the second metal or both comprise Au, Ag, Pt, Cu, W, TiW, TiN, TaN, WN, $Al_2O_3$ or mixtures and alloys thereof.

9. The method of claim 6, wherein the dielectric layer comprises $Ta_2O_5$, $Al_2O_3$ or other vapor phase dielectrics.

10. A method of making a capacitive device within one or more three-dimensional structures etched within a single photosensitive glass ceramic substrate, wherein the one or more etched three-dimensional structures have an anisotropic etch ratio of at least 30:1, comprising the steps of:
    providing a photosensitive glass ceramic substrate comprising at least silica, lithium oxide, aluminum oxide, and cerium oxide;
    masking a design layout on the photosensitive glass ceramic substrate, wherein the design layout comprises one or more structures to form one or more electrical conduction paths;
    exposing at least one portion of the photosensitive glass ceramic substrate to an activating energy source;
    heating the photosensitive glass ceramic substrate to a heating phase of at least ten minutes above its glass transition temperature;
    cooling the photosensitive glass ceramic substrate to transform at least part of the exposed photosensitive glass ceramic substrate to a crystalline material to form a glass-crystalline substrate;
    etching the glass-crystalline substrate with an etchant solution to form one or more three dimensional etched structures in the glass-crystalline substrate;
    converting a portion of the glass-crystalline substrate adjacent to the one or more three dimensional etched structures to a ceramic phase;
    rinsing an interior surface of each of the one or more three dimensional etched structures with a dilute glass etchant to increase a surface area of the interior surface to increase a capacitance of the capacitive device;
    coating at least a portion of the interior surface of each of the one or more three dimensional etched structures with a first metal to form a bottom electrode;
    coating at least a portion of the bottom electrode with a dielectric media;
    coating at least a portion of the dielectric media with a second metal to form a top electrode;

removing at least a portion of the top electrode and the dielectric media to provide an electrical contact that makes an electrical connection between the capacitive device and a circuitry; and connecting the bottom electrode, the top electrode or both to a circuitry through a surface of the capacitive device or an electrical contact buried in the capacitive device.

11. The method of claim 10, wherein the coating of the first metal, the second metal or both uses atomic layer deposition.

12. The method of claim 10, wherein the first metal, the second metal or both comprise Au, Ag, Pt, Cu, W, TiW, TiN, TaN, WN, $Al_2O_3$ or mixtures and alloys thereof.

13. The method of claim 10, wherein the dielectric layer comprises $Ta_2O_5$, $Al_2O_3$ or other vapor phase dielectrics.

* * * * *